(12) United States Patent
Lee et al.

(10) Patent No.: US 11,536,883 B2
(45) Date of Patent: Dec. 27, 2022

(54) COLOR CONVERSION PANEL AND DISPLAY DEVICE INCLUDING THE SAME

(71) Applicant: Samsung Display Co., LTD., Yongin-si (KR)

(72) Inventors: Myoung Jong Lee, Cheonan-si (KR); Jea Heon Ahn, Hwaseong-si (KR); Jang-Il Kim, Asan-si (KR); Jeong Ki Kim, Hwaseong-si (KR); Jong-Hoon Kim, Seoul (KR); Seok-Joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 249 days.

(21) Appl. No.: 16/882,839

(22) Filed: May 26, 2020

(65) Prior Publication Data

US 2021/0103079 A1 Apr. 8, 2021

(30) Foreign Application Priority Data

Oct. 7, 2019 (KR) .......................... 10-2019-0123993

(51) Int. Cl.
*G02F 1/1335* (2006.01)
*H01L 51/52* (2006.01)
(Continued)

(52) U.S. Cl.
CPC ....... *G02B 5/201* (2013.01); *G02F 1/133512* (2013.01); *G02F 1/133514* (2013.01);
(Continued)

(58) Field of Classification Search
CPC ......... H01L 23/544; H01L 2223/54486; H01L 2223/54426; G02F 1/133354; G02F 1/133374; G02F 1/133512
See application file for complete search history.

(56) References Cited

U.S. PATENT DOCUMENTS 5,850,276 A * 12/1998 Ochi ................. G02F 1/133526
349/158
2006/0049408 A1* 3/2006 Sohn ..................... G02F 1/1333
257/72

(Continued)

FOREIGN PATENT DOCUMENTS

JP 2007256581 A 10/2007
KR 10-0768491 B1 10/2007
KR 10-1308751 B1 9/2013

*Primary Examiner* — Michael H Caley
*Assistant Examiner* — Jonathan Y Jung
(74) *Attorney, Agent, or Firm* — Cantor Colburn LLP

(57) ABSTRACT

A display device includes: a substrate including an alignment area in a non-display area, and a display area including a plurality of material layers on the substrate; in the alignment area, a plurality of keys including a first alignment key and a second alignment key. Each alignment key includes a light blocking pattern, a layer pattern and a display pattern. The position of the display pattern within the first alignment key is different from the position of the display pattern within the second alignment key, the layer pattern of the alignment key and one material layer among the plurality of material layers are respective portions of a same material layer on the substrate, and the layer pattern of the first alignment key and the layer pattern of the second alignment key are respective portions of different material layers among the plurality of material layers on the substrate.

20 Claims, 12 Drawing Sheets

(51) Int. Cl.
*H01L 27/32* (2006.01)
*H01L 23/544* (2006.01)
*G02B 5/20* (2006.01)
*G02F 1/13357* (2006.01)

(52) U.S. Cl.
CPC ...... *G02F 1/133617* (2013.01); *H01L 23/544* (2013.01); *H01L 27/322* (2013.01); *H01L 51/5268* (2013.01); *H01L 51/5281* (2013.01); *H01L 2223/54426* (2013.01)

(56) References Cited

U.S. PATENT DOCUMENTS

2006/0279687 A1* 12/2006 Park ................ G02F 1/1333
349/142
2008/0030666 A1* 2/2008 Abe ................ G02F 1/13452
361/679.02
2019/0229066 A1* 7/2019 Chang ................ H01L 23/544

\* cited by examiner

COLOR CONVERSION PANEL AND DISPLAY DEVICE INCLUDING THE SAME

This application claims priority to Korean Patent Application No. 10-2019-0123993 filed on Oct. 7, 2019, and all the benefits accruing therefrom under 35 U.S.C. § 119, the entire contents of which are incorporated herein by reference.

BACKGROUND

(a) Field

The present disclosure relates to a color conversion display panel and a display device including the same. More particularly, the present disclosure relates to a color conversion display panel and an alignment key and a display device including the same.

(b) Description of the Related Art

A display device is a device which displays an image, and includes a liquid crystal display device and an organic light emitting display device.

The liquid crystal display device includes two field generating electrodes, a liquid crystal layer, a color filter, a polarizer and the like, and light loss may occur in the polarizer and the color filter.

The organic light emitting display device includes an organic light emitting element, and includes protection from external elements such as oxygen and moisture since the organic light emitting display device is sensitive to such external elements. An encapsulation layer of the organic light emitting display device protects the organic light emitting element from such external elements, however, may interrupt operation of the display device such as by reducing optical efficiency thereof.

SUMMARY

Exemplary embodiments of a display device provide an alignment state of each layer of a color conversion display panel which can be determined by using an alignment key.

A display device includes: a substrate including a non-display area including an alignment area, and a display area including a plurality of material layers arranged along a thickness direction of the substrate; and in the alignment area, a plurality of alignment keys including a first alignment key and a second alignment key. Each of an alignment key among the first alignment key and the second alignment key includes a light blocking pattern, a layer pattern, and a display pattern. The position of the display pattern within the first alignment key is different from the position of the display pattern within the second alignment key, among the plurality of positions of the alignment key, the layer pattern of the alignment key and one material layer among the plurality of material layers of the display area, are respective portions of a same material layer on the substrate, and the layer pattern of the first alignment key and the layer pattern of the second alignment key are respective portions of different material layers among the plurality of material layers on the substrate.

The light blocking pattern, the layer pattern, and the display pattern may be in a same layer.

The display pattern may be at a corner of the light blocking pattern, and the corner may not overlap the alignment key.

The display pattern may contact a corner of the light blocking pattern.

The light blocking pattern or the layer pattern may be in a shape of a square.

The alignment key may further include an opening between the light blocking pattern and the layer pattern, and the light blocking pattern may surround the opening.

The light blocking pattern may be patterned before the layer pattern is patterned, and the display pattern may be patterned in a same process as the light blocking pattern or the layer pattern.

The layer pattern may be a portion of a same material layer as at least one of a light blocking member layer, a color filter layer, a color conversion layer, and a light transmissive layer in the display area, depending on a position of the display pattern within the alignment key.

A display device includes: a substrate including a non-display area including an alignment area, and a display area including a plurality of material layers arranged along a thickness direction of the substrate; and a plurality of alignment keys in the alignment area, each of an alignment key among the plurality of alignment keys including a light blocking pattern having a shape of a polygon including an outer edge which defines an outer border of the alignment key, a layer pattern inside of the light blocking pattern and spaced apart therefrom, a plurality of positions spaced apart from each other along the outer edge of the light blocking pattern, and at different positions among the plurality of positions, a plurality of display patterns respectively extended from the outer edge of the light blocking pattern, in a direction away from the layer pattern. A combination of the different positions of the plurality of display patterns within the alignment key corresponds to one material layer among the plurality of material layers of the display area, and the layer pattern within the alignment key and the one material layer among the plurality of material layers of the display area which corresponds to the combination of the different positions of the plurality of display patterns within the alignment key, are respective portions of a same material layer on the substrate.

The light blocking pattern, the layer pattern, and the display pattern may be in a same layer.

The layer pattern inside of the light blocking pattern may be spaced apart from the light blocking pattern along a first direction and a second direction which crosses the first direction, the light blocking pattern may include a corner area extended further than the layer pattern along both the first direction and the second, and each of the different positions of the plurality of display patterns may be within the corner area of the light blocking pattern.

The display pattern may contact a corner of the light blocking pattern.

The alignment key may further include an opening between the light blocking pattern and the layer pattern, and the light blocking pattern may surround the opening.

The light blocking pattern may be patterned before the layer pattern is patterned, and the display pattern may be patterned in a same process as the light blocking pattern or the layer pattern.

A color conversion display panel may be in the display area, and the color conversion display panel may define the plurality of material layers including: a first lower light blocking member, a second lower light blocking member, and a third lower light blocking member n the substrate; an upper light blocking member on the lower light blocking member; a red color filter between the first lower light blocking member and the second lower light blocking member; a green color filter between the second lower light blocking member and the third lower light blocking member; a red color conversion layer on the red color filter; a green color conversion layer on the green color filter; a transmissive layer on the third lower light blocking member; and an auxiliary light blocking member on the upper light blocking member.

The layer pattern may be a portion of a same material layer as any one of the lower light blocking member, the upper light blocking member, the red color filter, the green color filter, the red color conversion layer, the green color conversion layer, the transmissive layer, and the auxiliary light blocking member.

The lower light blocking member may block blue light.

The red color conversion layer and the green color conversion layer may include semiconductor nanocrystals, and the transmissive layer may include scatterers.

A display device includes: a substrate including a display area including: a lower light blocking member; and an upper light blocking member facing the substrate with the lower light blocking member therebetween; and a non-display area adjacent to the display area and including an alignment area; and a plurality of alignment keys in the alignment area, including a first alignment key and a second alignment key spaced apart from each other, each of an alignment key among the first alignment key and the second alignment key including an outer border, and a first position and a second position spaced apart from each other along the outer border. The first alignment key includes: a first light blocking pattern including an outer edge which defines an outer border of the first alignment key, a first layer pattern inside of the first light blocking pattern and spaced apart therefrom, and at the first position of the alignment key, a first display pattern extended from the outer edge of the first light blocking pattern, in a direction away from the first layer pattern, where the first layer pattern of the first alignment key and the lower light blocking member of the display area are respective portions of a same material layer on the substrate; and the second alignment key includes: a second light blocking pattern including an outer edge which defines an outer border of the second alignment key, a second layer pattern inside of the second light blocking pattern and spaced apart therefrom, and at the second position of the alignment key, a second display pattern extended from the outer edge of the second light blocking pattern, in a direction away from the second layer pattern, where the second layer pattern of the second alignment key and the upper light blocking member of the display area are respective portions of a same material layer on the substrate.

The first layer pattern inside of the first light blocking pattern may be spaced apart from the first light blocking pattern along a first direction and a second direction which crosses the first direction, the first light blocking pattern may include a corner area extended further than the first layer pattern along both the first direction and the second direction, and the first position and the second position of the alignment key may be within the corner area of the first light blocking pattern.

According to one or more exemplary embodiment, the overlay state of each layer within a display area may be easily determined by using an alignment key including a display pattern corresponding to the each layer within the display area, such as within a color conversion display panel. Accordingly, reliability and accuracy of a manufacturing process of a display device can be improved.

In addition, when an overlay of layers within the alignment key is measured, a measurement area of the alignment key is not affected since display patterns within the alignment key do not overlap the measurement area. Accordingly, an overlay of layers within the alignment key can be accurately measured to determine the overlay state of layers within a display area.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
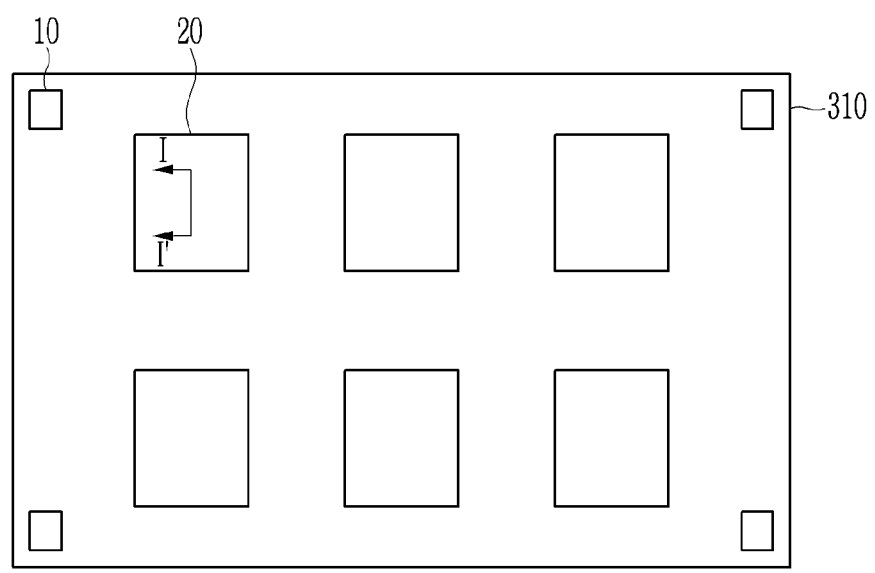
FIG. 1 schematically illustrates an exemplary embodiment of a display device.

In the following detailed description, embodiments of the invention have been shown and described, simply by way of illustration. As those skilled in the art would realize, the described embodiments may be modified in various different ways, all without departing from the spirit or scope of the invention.

Accordingly, the drawings and description are to be regarded as illustrative in nature and not restrictive. Like reference numerals designate like elements throughout the specification In addition, since the size and thickness of each configuration shown in the drawings are arbitrarily expressed for better understanding and ease of description, the invention is not necessarily limited to that shown. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. The word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device that includes a color conversion display panel has been used to protect an organic light emitting element from harmful contaminants and increase optical efficiency in the organic light emitting display device, in addition to reducing or effectively preventing light loss in a liquid crystal display device.

The color conversion display panel may include various layers which are respectively aligned with each other. To maintain an accurate alignment state of the various layers, patterns such as a plurality of alignment keys are provided or formed in a non-display area of a substrate within a display device.

Hereinafter, a color conversion panel according to an exemplary embodiment will be described.

Figure 2:
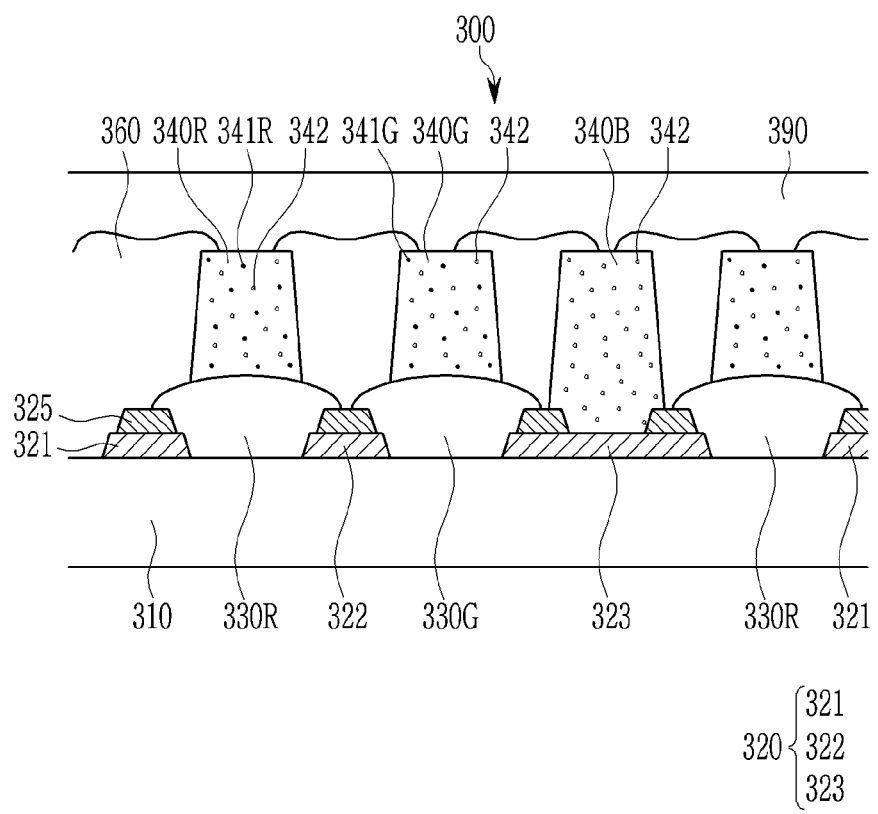
FIG. 2 shows an exemplary embodiment of a color conversion display panel of a display device.

FIG. 1 schematically illustrates an exemplary embodiment of a display device, and FIG. 2 shows an exemplary embodiment of a color conversion display panel of a display device.

Referring to FIG. 1, a display device includes a display panel 20 provided in plural (e.g., a plurality of display panels 20) disposed on a single one of a substrate 310, and an alignment area 10 that is disposed in a non-display area, that is, areas other than the display panels 20. Each display panel 20 may imply or correspond to a display area of the display device at which an image is displayed. The display area may be adjacent to the non-display area. A same one of the substrate 310 may include a non-display area and a display area corresponding to those described above for the display device. The substrate 310 may be common to the non-display area and each of the display areas.

The substrate 310, the collection of the display panels 20 and the non-display area described above for FIG. 1 may be referred to as a preliminary form of a display device. In an exemplary embodiment, one or more the display panels 20 and a corresponding portion of the substrate 310 may be separated from each other to provide an individual display device, without being limited thereto. For convenience of description, the substrate 310, the collection of the display panels 20 and the non-display area described above for FIG. 1 are hereinafter referred to as a display device.

The display device, the display panel 20, the substrate 310 and various components thereof may be disposed in a plane defined along a first direction and a second direction which cross each other. Referring to FIG. 1, for example, a horizontal direction and a vertical direction may variously represent the first direction or the second direction. A thickness of the display device, the display panel 20, the substrate 310 and various components thereof may be defined along a third direction which crosses each of the first direction and the second direction. Referring to FIG. 2, for example, a vertical direction may represent the third direction (e.g., thickness direction), while a horizontal direction may represent the first direction and/or the second direction.

The display panel 20 includes a color conversion display panel 300 (FIG. 2), which will be described later. Even though not illustrated, the display panel 20 may further include a transistor display panel in which a driving element such as a thin film transistor, a capacitor, and the like is disposed.

The alignment area 10 may be disposed at each of four corners of the substrate 310, depending on exemplary embodiments, but is not limited thereto. The alignment area 10 may be disposed at various positions and/or quantities within the non-display area. In addition, the alignment area 10 includes an alignment key provided in plural (e.g., a plurality of alignment keys), and a material pattern of an alignment key may be provided or formed corresponding to each layer among layers within the display panel 20. The alignment key will be described in detail later with reference to FIG. 3.

Referring to FIG. 2, the color conversion display panel 300 includes a color filter layer that includes the substrate 310, a light blocking member layer, a red color filter 330R and a green color filter 330G, a color conversion layer that includes a red color conversion layer 340R and a green color conversion layer 340G, and a transmissive layer 340B. The red color filter 330R, the green color filter 330G, the red color conversion layer 340R, the green color conversion layer 340G, and the transmissive layer 340B may correspond to a light emitting area at which light is emitted, such as for displaying an image. Portions of the color filter layer, the light blocking member layer and the color conversion layer may be referred to as a color filter pattern, a light blocking pattern and a color conversion pattern, respectively.

The light blocking member layer within the color filter layer is disposed on the substrate 310, and includes a lower light blocking member 320 and an upper light blocking member 325.

The lower light blocking member 320 includes a first lower light blocking member 321, a second lower light blocking member 322, and a third lower light blocking member 323, in order along the substrate 310. In a direction along the substrate 310, the first lower light blocking member 321, the second lower light blocking member 322, and the third lower light blocking member 323 are respectively between the red color filter 330R and the green color filter 330G which are adjacent to each other. The third lower light blocking member 323 is disposed corresponding to the transmissive layer 340B. The first lower light blocking member 321, the second lower light blocking member 322, the third lower light blocking member 323, the red color filter 330R and the green color filter 330G are disposed in a same plane. Each of the first lower light blocking member 321, the second lower light blocking member 322, the third lower light blocking member 323, the red color filter 330R and the green color filter 330G may contact (e.g., form an interface with) the substrate 310, while the transmissive layer 340B does not contact the substrate 310.

The lower light blocking member 320 is provided for blocking blue light that enters through the top surface thereof (e.g., top surface furthest from the substrate 310). The lower light blocking member 320 may be provided or formed by combining one of $BiO_2$, $ZnO$, and $Ce_2O_3$ and one of $CaCO_3$, $ZrO_2$, $TiO$, and $Ar_2O_3$, but this is not restrictive. The lower light blocking member 320 may be provided or formed of any material which blocks blue light.

The upper light blocking member 325 may be provided in plural (e.g., upper light blocking members 325) disposed on the lower light blocking member 320. The lower light blocking member 320 is between the substrate 310 and the upper light blocking member 325. A single one of the upper light blocking member 325 (e.g., an upper light blocking pattern) is disposed on each one of the first lower light blocking member 321 and the second lower light blocking member 322, and two of the upper light blocking members 325 are disposed on a same one of the third lower light blocking member 323. Accordingly, in a direction along the substrate 310, the upper light blocking members 325 are disposed between the red color filter 330R and the green color filter 330G and between the green color filter 330G and the transmissive layer 340B. The upper light blocking member 325 may further block light incident from an upper surface (e.g., upper surface furthest from the substrate 310) together with the lower light blocking member 320.

The lower light blocking member 320 and the upper light blocking member 325 reduce or effectively prevent mixing of colored light respectively emitted from adjacent pixels where the red color filter 330R, the green color filter 330G and the transmissive layer 340B are provided or formed. The lower light blocking member 320 and the upper light blocking member 325 may include or be formed of any material that can block (i.e., reflect or absorb) light. In addition, the light blocking member layer including the lower light blocking member 320 and the upper light blocking member 325 may further include an auxiliary light blocking member 360, which will be described later. The auxiliary light blocking member 360 may partition regions in which the red color conversion layer 340R, the green color conversion layer 340G and the transmissive layer 340B are disposed.

In a direction along the substrate 310, the red color filter 330R is disposed between portions of the lower light blocking member 320 and portions of the upper light blocking member 325, on the substrate 310. The red color filter 330R selectively passes red light among light incident to the color filter layer, which will be described later. Here, the red color filter 330R may be referred to a first color filter, and the green color filter 330G may be referred to a second color filter.

In a direction along the substrate 310, the green color filter 330G is disposed between portions of the lower light blocking member 320 and portions the upper light blocking member 325, on the substrate 310. The green color filter 330G selectively passes blue light among light incident to the color filter layer. That is, in an embodiment, green light and red light are filtered at the red color filter 330R and the green color filter 330G, from among incident white light, to pass blue light.

The color conversion layer includes a red color conversion layer 340R and a green color conversion layer 340G, and the red color conversion layer 340R and the green color conversion layer 340G are disposed corresponding to the red color filter 330R and the green color filter 330G, respectively. The color conversion layer may convert a color of the incident light (e.g., color-convert light) into light having a different wavelength (e.g., a different color) from that of the incident light and emit the color-converted light. Here, the red color conversion layer 340R may be referred to a first color conversion layer, and the green color conversion layer 340G may be referred to a second color conversion layer.

The red color conversion layer 340R may include a first semiconductor nanocrystal 341R provided in plural (e.g., first semiconductor nanocrystals 341R) for color-converting incident blue light into red light as a color-converted light. The first semiconductor nanocrystals 341R may include at least one of a red phosphor and a quantum dot. The red phosphor may including a material of at least one of $(Ca, Sr, Ba)S$, $(Ca, Sr, Ba)_2Si_5N_8$, $(CaAlSiN_3)$, $CaMoO_4$, and $Eu_2Si_5N_8$.

The green color conversion layer 340G may include a second semiconductor nanocrystal 341G provided in plural (e.g., second semiconductor nanocrystals 341G) for color-converting incident blue light to green light as a color-converted light. The second semiconductor nanocrystals 341G may include at least one of a green phosphor and a quantum dot. The green phosphor may include at least one selected from yttrium aluminum garnet (YAG), (Ca, Sr, Ba)$_2$SiO$_4$, SrGa$_2$S$_4$, barium magnesium aluminate (BAM), alpha SiAlON (α-SiAlON), beta SiAlON (β-SiAlON), Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, but this is not restrictive. Here, x may be a random number between 0 and 1.

At least one of the red color conversion layer 340R and the green color conversion layer 340G may further include a light scatterer (e.g., scatterer 342) provided in plural (e.g., scatterers 342). The content of each scatterer 342 included in the red color conversion layer 340R and the green color conversion layer 340G may be different. The scatterer 342 and the color-conversion materials discussed above (e.g., semiconductor material, phosphor, quantum dot, etc.) may be dispersed in a base material or medium within each pattern of the color conversion layer.

The transmissive layer 340B is disposed on the third lower light blocking member 323, and may pass incident light without color-conversion. The transmissive layer 340B may include a transparent polymer, and incident blue light is transmitted therethrough, thereby expressing a blue color. The transmissive layer 340B that corresponds to an area emitting the blue color light (e.g., light emitting area) includes a material which excludes or omits an additional phosphor or quantum dots, but may include the scatterer 342.

The auxiliary light blocking member 360 is disposed on the substrate 310, and is provided between the red color conversion layer 340R and the green color conversion layer 340G and between the green color conversion layer 340G and the transmissive layer 340B. The auxiliary light blocking member 360 faces the substrate 310 with the upper light blocking member 325 therebetween. The auxiliary light blocking member 360 may be in a same plane as the red color conversion layer 340R, the green color conversion layer 340G and the transmissive layer 340B. Portions of the auxiliary light blocking member 360 may be in a same plane as the red color filter 330R and the green color filter 330G. The auxiliary light blocking member 360 is designed to reducing or effectively prevent light mixing. Thus, when some of the light emitted from the color conversion layer travels laterally (e.g., along the substrate 310), the auxiliary light blocking member 360 scatters the light in various directions, and/or absorbs the light to thereby minimize the light from entering a neighboring color conversion layer region or transmissive layer 340B region.

A planarization layer 390 is disposed on the auxiliary light blocking member 360, the color conversion layer and the transmissive layer 340B. The planarization layer 390 may remove a step which is generated due to height differences between portions or patterns of the auxiliary light blocking member 360, the color conversion layer and the transmissive layer 340B, and may provide a flat surface. Depending on exemplary embodiments, the planarization layer 390 may be omitted.

Although not illustrated in FIG. 2, a thin film transistor array panel in which an organic light emitting element is encapsulated, is disposed facing the substrate 310 with the planarization layer 390 therebetween such that an organic light emitting diode ("OLED") display can be implemented. Here, a buffering member and an adhesion member (not shown) may be disposed between the thin film transistor array panel and the color conversion display panel 300.

In addition, the thin film transistor display panel may be disposed facing the substrate 310 with the planarization layer 390 therebetween, while disposing a liquid crystal layer between the thin film transistor array panel and the color conversion display panel 300, thereby implementing a liquid crystal display ("LCD").

Hereinabove, the structure of the color conversion display panel 300 according to exemplary embodiments have been described. In order to determine whether the light blocking member layer, the color filter layer, the color conversion layer, and the transmissive layer 340B of the color conversion display panel 300 are provided or formed at desired positions along the substrate 310, an alignment key of the alignment region may be used, and the alignment key will be described with reference to FIG. 3, FIG. 4, and FIG. 5.

Figure 3:
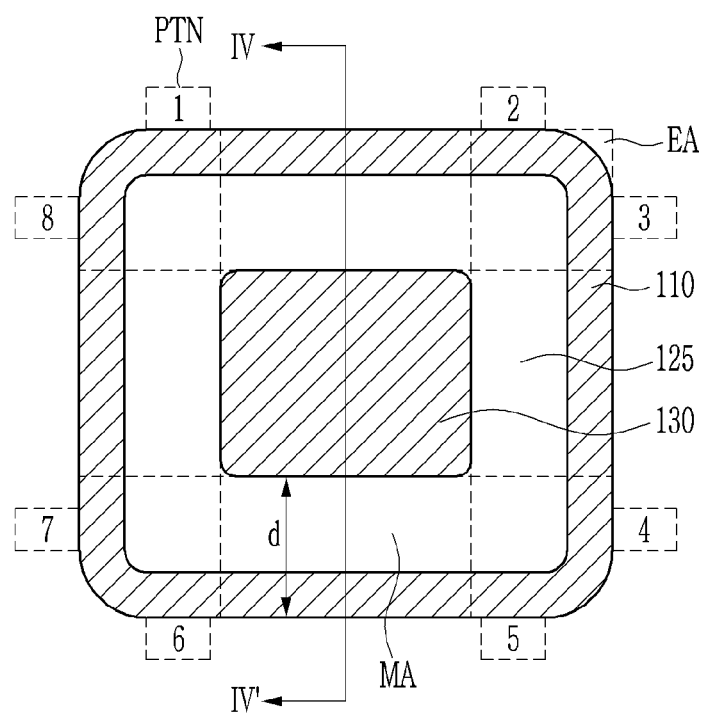
FIG. 3 exemplarily illustrates an exemplary embodiment of a single alignment key in an alignment area of a display device.
Figure 4:
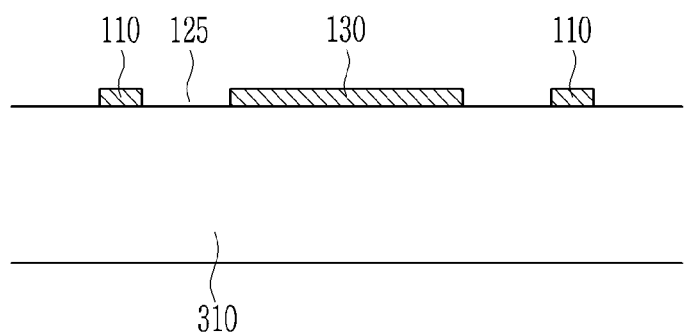
FIG. 4 is a cross-sectional view along line IV-IV' of FIG. 3.
Figure 5:
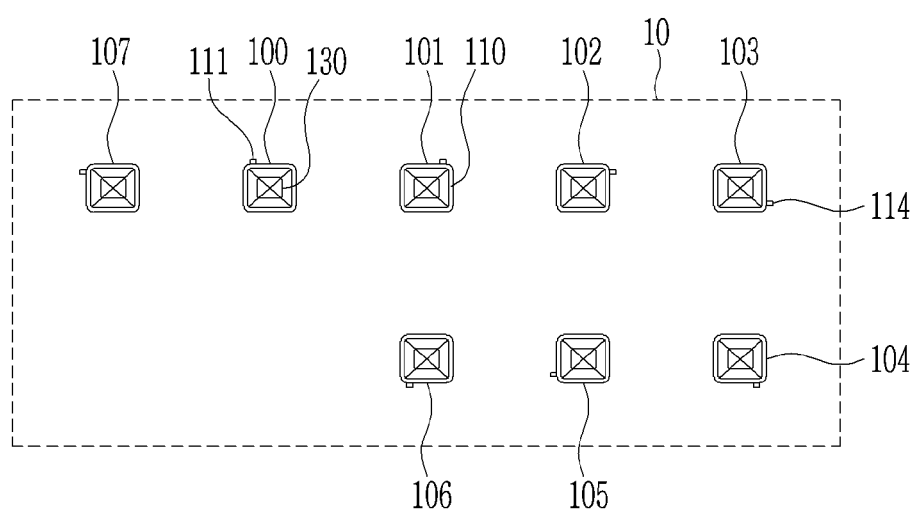
FIG. 5 is an exemplary embodiment of a plurality of alignment keys in an alignment area of a display device.

FIG. 3 exemplarily illustrates an exemplary embodiment of a single alignment key provided in an alignment area 10 of a display device, and FIG. 4 is a cross-sectional view of FIG. 3 along line IV-IV' in FIG. 3. FIG. 5 exemplarily illustrates an exemplary embodiment of a plurality of alignment keys provided in a single one of an alignment area 10 of a display device.

Referring to FIG. 3 and FIG. 4, one alignment key according to an exemplary embodiment includes a light blocking pattern 110, a layer pattern 130, an opening 125 defined between the light blocking pattern 110 and the layer pattern 130, and one or more of a display pattern PTN.

The light blocking pattern 110 is disposed at and defines borders of the alignment key, and the layer pattern 130 is disposed at a center of the alignment key. Portions of the light blocking pattern 110 respectively extend along the borders of the alignment key. Lengths of the portions extend along the borders of the alignment key, while a width or thickness of the portions is taken in a direction normal to a respective length. The light blocking pattern 110 and the layer pattern 130 are disposed at a distance d from each other along the substrate 310, and the opening 125 is defined between the light blocking pattern 110 and the layer pattern 130. In addition, the light blocking pattern 110, the opening 125, the layer pattern 130, and the display pattern PTN are disposed in a same layer among layers on the substrate 310. As being in the same layer, the light blocking pattern 110, the layer pattern 130 and the display pattern PTN may be respective portions of a same material layer provided on the substrate 310, without being limited thereto.

The light blocking pattern 110 is pre-patterned at the alignment area 10 on the substrate 310. In the exemplary embodiment, an outer edge line of the light blocking pattern 110 is provided or formed in the shape of a chamfered square, but is not limited thereto. In an exemplary embodiment, the light blocking pattern 110 may be provided or formed in the shape of a polygon having squared (e.g., rectilinear portion) corners such as a square, a pentagon, a hexagon, and the like.

In an exemplary embodiment of manufacturing a display device, the opening 125 may be provided or formed by removing a center portion of a material layer pattern for forming the light blocking pattern 110, and may be provided or formed in the shape of a square having chamfered edges at inner and outer corners thereof. Outer boundaries or outer edges of the opening 125 and the light blocking pattern 110 define a shape having a center thereof. The center of opening 125 is aligned with the center of the light blocking pattern 110 such that extended portions of the light blocking pattern 110 have a same width or thickness in a direction along the substrate 310.

The layer pattern 130 is disposed within the opening 125 in a top plan view. The layer pattern 130 is provided or formed in the shape of a chamfered square, such as a solid square having outer edges forming chamfered corners. That is, the layer pattern 130 is located inside the light blocking pattern 110 and is surrounded by the light blocking pattern 110. In an exemplary embodiment of manufacturing a display device, the layer pattern 130 may be provided or formed at the alignment area 10 after the light blocking pattern 110 and the opening 125 are provided or formed on the substrate 310.

The layer pattern 130 in the non-display area may include or be formed of a same material layer as at least one of a light blocking member layer, a color filter layer, a color conversion layer and a transmissive layer 340B that are disposed in the display panel 20, according to a position of a display pattern PTN, which will be described later. That is, in an exemplary embodiment of manufacturing a display device, the layer pattern 130 is a material pattern that is provided or formed through a same process which provides or forms at least one of the lower light blocking member 320, the upper light blocking member 325, the red color filter 330R, the green color filter 330G, the red color conversion layer 340R, the green color conversion layer 340G, the transmissive layer 340B, and the auxiliary light blocking member 360 of the color conversion display panel 300. The layer pattern 130 provided or formed corresponding to a respective layer or material pattern of the color conversion display panel 300 will be described in detail with reference to FIG. 6 to FIG. 9.

The display pattern PTN is disposed at the edge of the light blocking pattern 110. The display pattern PTN extends from an outer edge of the light blocking pattern 110. Specifically, the display pattern PTN is disposed at corners of the light blocking pattern 110. In an exemplary embodiment of manufacturing a display device, the display pattern PTN may be provided or formed by being patterned in a same process of providing or forming the light blocking pattern 110, and may be provided or formed by being patterned in a same layer process when the layer pattern 130 is provided or formed. That is, within the alignment key, the display pattern PTN and the light blocking pattern 110 are respective portions of a same patterned material layer on the substrate 310, or the display pattern PTN and the layer pattern 130 are respective portions of a same patterned material layer on the substrate 310. The display pattern PTN of the exemplary embodiment is illustrated as a rectangular shape (e.g., planar shape) connected with the light blocking pattern 110, but may be implemented in various planar shapes such as a triangle, a circle, a star, and the like.

The display pattern PTN may be disposed contacting an outer edge which forms the corners of the light blocking pattern 110, or may be disposed at a distance from the corner area of the light blocking pattern 110 (e.g., corner area including a corner and edges respectively extending in opposing directions therefrom). As being contacting, within the alignment key, the display pattern PTN may extend directly from an outer edge of the light blocking pattern 110. A corner area of the light blocking pattern 110 may be defined where a first side and a second side of the light blocking pattern 110 meet each other or where a virtual extension of the first side and a virtual extension of a second side of the light blocking pattern 110 meet each other.

Referring to FIG. 3, a side or outer edge of the layer pattern 130 faces a portion of a side or inner edge of the light blocking pattern 110, and a remaining portion of the side or inner edge of the light blocking pattern 110 does not face the layer pattern 130. An edge area EA (dotted line box) of the alignment key is a planar area defined along two directions which intersect each other, where the layer pattern 130 and the light blocking pattern 110 do not face each other. The edge area EA may include the corner area of the light blocking pattern 110. As illustrated in FIG. 3, borders of the edge area EA at a same corner of the alignment key, may be defined by virtual extensions of the outer edges of the light blocking pattern 110, together with virtual extensions of outer edges of the layer pattern 130. The edge area EA may be defined at each corner of the alignment key to define a plurality of edge areas EA. Referring again to FIG. 3, two edge areas EA are spaced apart from each other along the horizontal direction and along the vertical direction.

Referring to FIG. 3, within the alignment key, the layer pattern 130 inside of the light blocking pattern 110 is spaced apart from the light blocking pattern 110 along a first direction and a second direction which crosses the first direction, the light blocking pattern 110 includes a corner area (e.g., portions at edge area EA) extended further than the layer pattern 130 along both the first direction and the second direction, and the position of the display pattern PTN along an outer edge of the light blocking pattern 110 is disposed within the corner area of the light blocking pattern 110.

A measurement area MA is defined by a portion of the opening 125 which is disposed between the two edge areas EA spaced apart from each other. Referring to FIG. 3, the measurement area MA may be defined at an area where a side or outer edge of the layer pattern 130 faces a portion of a side or inner edge of the light blocking pattern 110. The measurement area MA may be provided in plural to define a plurality of measurement areas MA, such as four measurement areas MA within the alignment key. That is, the edge area EA is a planar area of the alignment key which excludes the measurement area MA where the side of the layer pattern 130 and the side of the light blocking pattern 110 face each other (e.g., to be overlapped with each other along the horizontal or along the vertical direction, respectively) within the alignment key.

In order to describe the position of the display pattern PTN shown in FIG. 3, the corner of the light blocking pattern 110 is partitioned into first to eighth positions, and illustrated as dotted lines. The Arabic numbers 1, 2, 3, 4, 5, 6, 7, 8, and 9 displayed at the positions marked by the dotted line in FIG. 3 respectively imply the first to eighth positions. Accordingly, when the display pattern PTN is positioned at the first position, the display pattern PTN may be referred to as a first display pattern 111, when the display pattern PTN is positioned at the second position, the display pattern PTN may be referred to as a second display pattern, and when the display pattern PTN is positioned at the third position, the display pattern PTN may be referred to as a third display pattern. In the exemplary embodiment, the first to eighth positions are named in the clockwise direction from the upper left side when the light blocking pattern 110 is viewed from the front, but depending on exemplary embodiments, the first position may be named in the clockwise direction from the upper right side, or may be named in the counter-clockwise direction sequentially.

In addition, the display pattern PTN may be formed in different positions within each alignment key, and a position within the alignment key may define from which layer within the color conversion display panel 300 the display pattern PTN is provided. In an exemplary embodiment, for example, when a first alignment key 100 includes a display pattern PTN positioned at a first position (dotted line box 1 in FIG. 3), the display pattern PTN is defined or provided from a portion of a material layer from which a layer pattern of a color conversion display panel 300 is provided or formed. That is, a material layer on the substrate 310 from which a layer pattern 130 of an alignment key is provided, is defined based on (or corresponds to) a material layer from which an element or corresponding pattern of the color conversion display panel 300 is provided. Thus, since the layer pattern 130 of an alignment key (e.g., in the non-display area) and the element or corresponding pattern of the color conversion display panel 300 are respective portions of a same material layer on the substrate 310, an alignment of the element or corresponding pattern of the color conversion display panel 300 within the display panel 20 (e.g., display area) can be determined according to an alignment of the layer pattern 130 within a corresponding alignment key.

Referring to FIGS. 2 and 5, for example, within an exemplary embodiment of a single one of the alignment area 10, a first alignment key 100 may indicate whether a lower light blocking member 320 (e.g., first material layer) of the color conversion display panel 300 is properly aligned, a second alignment key 101 may indicate whether the upper light blocking member 325 (e.g., second material layer) of the color conversion display panel 300 is properly aligned, and a third alignment key 102 may indicate whether the red color filter 330R is properly aligned. In addition, a fourth alignment key 103 indicates whether the green color filter 330G is properly aligned and a fifth alignment key 104 indicates whether the transmissive layer 340B is properly aligned. In addition, a sixth alignment key 105 may indicate whether the red color conversion layer 340R is properly aligned, a seventh alignment key 106 may indicate whether the green color conversion layer 340G is properly aligned, and an eighth alignment key 107 may indicate whether the auxiliary light blocking member 360 is properly aligned. The lower light blocking member, the upper light blocking member 325, the red color filter 330R, the green color filter 330G, the transmissive layer 340B, the red color conversion layer 340R, the green color conversion layer 340G and the auxiliary light blocking member 360 of the color conversion display panel 300 may be respectively referred to as a pattern layer of the color conversion display panel 300.

Referring again to FIG. 5, within a same one of the alignment area 10, the plurality of alignment keys are aligned in a row direction (e.g., horizontal direction) and a column direction (e.g., vertical direction), and are disposed spaced apart from each other at intervals which may be regular or constant, without being limited thereto. The plurality of alignment keys include light blocking patterns 110 that are the same in shape and size as each other, layer patterns 130, and display patterns PTN that are disposed at different positions along the alignment area 10.

In FIG. 5, eight alignment keys are exemplarily illustrated, and each of the eight alignment keys includes a different one of the display pattern PTN at different positions or combination of positions. The eight alignment keys are provided or formed in the alignment area 10 corresponding to the color conversion display panel 300 that includes eight layers. Layers of material to be respectively provided or formed in the eight alignment keys correspond to the eight layers of material (e.g., for forming members, filters, layers, etc.) of the color conversion display panel 300 are set in advance.

In an exemplary embodiment of manufacturing a display device, the lower light blocking member 320, the upper light blocking member 325, the red color filter 330R, the green color filter 330G, the transmissive layer 340B, the red color conversion layer 340R, the green color conversion layer 340G, and the auxiliary light blocking member 360 of a color conversion display panel 300 are provided or formed. These various members, filters and layers may be sequentially provided or formed, such as on a substrate 310 arranged along a thickness direction of the substrate 310.

In an exemplary embodiment, a first one of the layer pattern 130 (e.g., a first layer pattern 130) is provided or formed as a portion of a same material layer as the lower light blocking member 320 in the first alignment key 100 that includes the first display pattern 111 provided or formed at the first position (dotted line box 1 in FIG. 3), a second one of the layer pattern 130 (e.g., a second layer pattern 130) is provided or formed as a portion of a same material layer as the upper light blocking member 325 in the second alignment key 101 that includes the second display pattern provided or formed at the second position (dotted line box 2 in FIG. 3), and a third one of the layer pattern 130 (e.g., a third layer pattern 130) is provided or formed as a portion of a same material layer as the red color filter 330R in the third alignment key 102 that includes the third display pattern provided or formed at the third position (dotted line box 3 in FIG. 3). In addition, a fourth one of the layer pattern 130 (e.g., a fourth layer pattern 130) is provided or formed as a portion of a same material layer as the green color filter 330G in the fourth alignment key 103 that includes the fourth display pattern 114 provided or formed at the fourth position (dotted line box 4 in FIG. 3), a fifth one of the layer pattern 130 (e.g., a fifth layer pattern 130) is provided or formed as a portion of a same material layer as the transmissive layer 340B in the fifth alignment key 104 that includes the fifth display pattern provided or formed at the fifth position (dotted line box 5 in FIG. 3), a sixth one of the layer pattern 130 (e.g., a sixth layer pattern 130) is provided or formed as a portion of a same material as the red color conversion layer 340R in the sixth alignment key 105 that includes the sixth display pattern provided or formed at the sixth position (dotted line box 6 in FIG. 3), a seventh one of the layer pattern 130 (e.g., a seventh layer pattern 130) is provided or formed as a portion of a same material as the green color conversion layer 340G in the seventh alignment key 106 that includes the seventh display pattern provided or formed at the seventh position (dotted line box 7 in FIG. 3), and an eighth one of the layer pattern 130 (e.g., an eighth layer pattern 130) is provided or formed as a portion of a same material layer as the auxiliary light blocking member 360 in the eighth alignment key 107 that includes the eighth display pattern provided or formed at the eighth position (dotted line box 8 in FIG. 3).

Thus, according to one or more exemplary embodiment, alignment states of the lower light blocking member 320, the upper light blocking member 325, the red color filter 330R, the green color filter 330G, the transmissive layer 340B, the red color conversion layer 340R, the green color conversion layer 340G, and the auxiliary light blocking member 360 can be respectively determined through the first layer pattern 130 to the eighth layer pattern 130 provided or formed in the first alignment key 100 to the eighth alignment key 107. That is, although the layer patterns 130 have the same shape and size as each other in a same one of the alignment area 10 of the non-display area, identification of what member, filter, layer, pattern, etc. of the color conversion display panel 300 is provided or formed in the display device (FIG. 1) is based on a position of the display pattern PTN within a corresponding alignment key. Accordingly, correction in a layer forming process for manufacturing a display device may be immediate, thereby improving the reliability and accuracy of the manufacturing process for a display device.

In one or more exemplary embodiment, alignment keys respectively corresponding to layers of the color conversion display panel 300, from the lower light blocking member 320 to the auxiliary light blocking member 360 (refer to FIG. 2), are provided or formed respectively corresponding to the first position to the eighth position of the display patterns PTN (refer to FIGS. 3 and 5), but are not limited thereto. The positions of the display patterns PTN and layers of the color conversion display panel 300 may correspond differently from the above description.

In addition, in an exemplary embodiment, a quantity of alignment keys may be provided or formed to be equal to a quantity of layers of the color conversion display panel 300, but is not limited thereto. The quantity of alignment keys may be larger than the number of layers the color conversion display panel 300. In an exemplary embodiment of a manufacturing process of the color conversion display panel 300 including the light blocking member, the color filter and the color conversion layer, the quantity of alignment keys can be variously modified according to the quantity of members, filters, layers, etc.

An overlay of a layer may be determined by measuring a distance d between one side (e.g., outer edge) of the layer pattern 130 and an outer edge (or outer edge line) of the light blocking pattern 110. Thus, when the layer pattern 130 is disposed at a center of the light blocking pattern 110, a layer of the color conversion display panel 300 corresponding to the layer pattern 130 may be determined to be properly aligned.

Referring back to FIG. 3, if the display pattern PTN is provided or formed in the measurement area MA, the outer edge line of the display pattern PTN may be visible, and thus a distance d between one side (e.g., outer edge) of the layer pattern 130 and one side (e.g., outer edge) of the light blocking pattern 110 cannot be accurately measured. In one or more exemplary embodiment, since the display pattern PTN is provided or formed at the corner area of an alignment key, the distance d between one side (e.g., outer edge) of the layer pattern 130 and one side (e.g., outer edge) of the light blocking pattern 110 can be accurately measured without affecting the measurement area MA.

Hereinafter, referring to FIG. 6 to FIG. 9, an alignment key that includes a layer pattern 130 and a display pattern corresponding to a member, filter and/or layer of a color conversion display panel 300 will be described.

Figure 6:
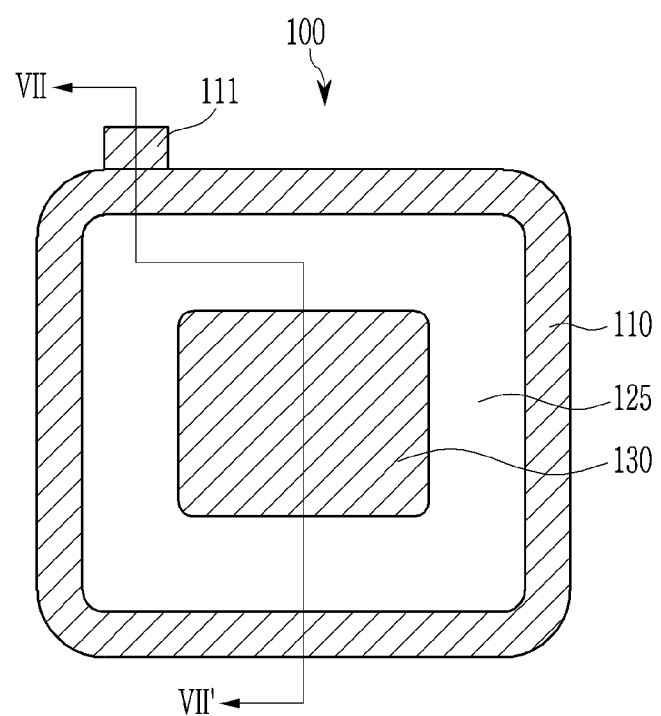
FIG. 6 illustrates an exemplary embodiment of an alignment key corresponding to a portion of a color conversion display panel in a display device.
Figure 7:
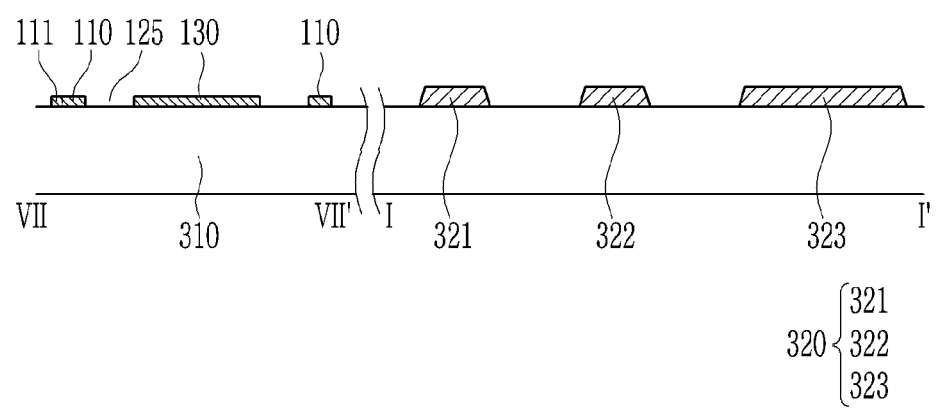
FIG. 7 is a cross-sectional view of the alignment key of FIG. 6 relative to the color conversion display panel taken along line I-I' of FIG. 1.
Figure 8:
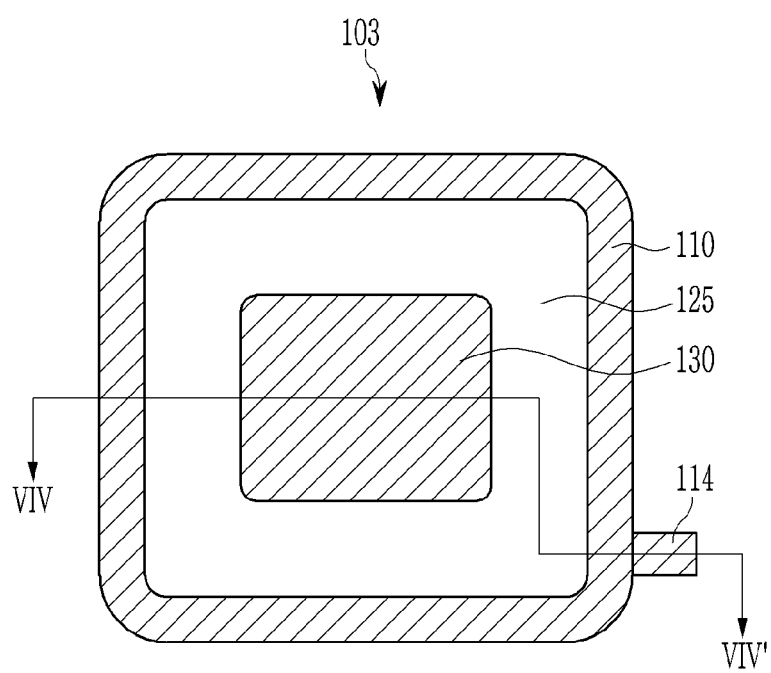
FIG. 8 illustrates an exemplary embodiment of an alignment key corresponding to a portion of a color conversion display panel of a display device.
Figure 9:
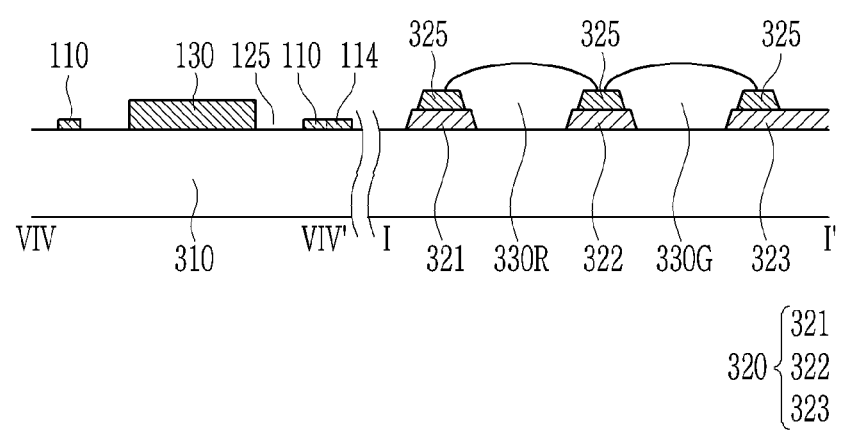
FIG. 9 is a cross-sectional view of the alignment key of FIG. 8 relative to the color conversion display panel taken along line I-I' of FIG. 1.

FIG. 6 illustrates an exemplary embodiment of the first alignment key 100, and FIG. 7 is a cross-sectional view of the first alignment key 100 taken along line VII-VII' of FIG. 6 and a color conversion display panel 300 taken along line I-I' of FIG. 1, in an exemplary embodiment of a method of manufacturing a display device. FIG. 8 illustrates an exemplary embodiment of the fourth alignment key 103, and FIG. 9 is a cross-sectional view of the fourth alignment key 103 taken along line VIV-VIV' in FIG. 8 and a color conversion display panel 300 taken along line I-I' of FIG. 1, in an exemplary embodiment of a method of manufacturing a display device.

Referring to FIG. 6 and FIG. 7, a first alignment key 100 includes a first light blocking pattern 110, a first display pattern 111, and a first layer pattern 130.

The first light blocking pattern 110, the first layer pattern 130 and the first display pattern 111 are disposed in an alignment area 10 of a substrate 310. The lower light blocking member 320 that includes a first lower light blocking member 321, a second lower light blocking member 322, and a third lower light blocking member 323, is disposed in a display panel 20 including a portion of the substrate 310.

The first light blocking pattern 110 and the first layer pattern 130 are disposed spaced apart from each other, while defining an opening 125 therebetween. The first display pattern 111 is disposed at an upper left corner area of the first light blocking pattern 110, and extends from an outer edge of the first light blocking pattern 110.

In an exemplary embodiment of a method of manufacturing a display device, the first light blocking pattern 110 is pre-patterned in the alignment area 10 before the first layer pattern 130 is provided or formed. The first light blocking pattern 110 defines an opening 125 surrounded by inner edges of the first light blocking pattern 110. The first display pattern 111 may be simultaneously patterned when the first light blocking pattern 110 is provided or formed, or may be patterned when the first layer pattern 130 is provided or formed. That is, the light blocking pattern 110 is a pattern of a first patterning process and the layer pattern 130 is pattern of a second patterning process is performed after the first patterning process, and the display pattern PTN is a pattern of the first patterning process or the second patterning process.

When the lower light blocking member 320 of the display panel 20 is provided or formed, the first layer pattern 130 is provided or formed within the opening 125 of the first alignment key 100. Accordingly, the first layer pattern 130 in the non-display area is provided or formed as respective portions of a same material layer on the substrate 310 as the lower light blocking member 320. Although FIG. 7 illustrates that the first layer pattern 130 is thicker than the first light blocking pattern 110 and thinner than the lower light blocking member 320, relative to an upper surface of the substrate 310, thicknesses of these patterns are not limited thereto. In an exemplary embodiment, the first layer pattern 130 may have a same thickness as the lower light blocking member 320 depending on a patterned material.

Thus, it can be determined that the lower light blocking member 320 is provided or formed in the color conversion display panel 300 since the first layer pattern 130 is provided or formed in the first alignment key 100 that includes the first display pattern 111. Additionally, it can be determined whether the lower light blocking member 320 is properly aligned within the display panel 20, depending on a position of the first layer pattern 130 relative to the first light blocking pattern 110 in the first alignment key 100 that includes the first display pattern 111. In an exemplary embodiment, when the first layer pattern 130 is disposed at a center of the first light blocking pattern 110 in the first alignment key 100 that includes the first display pattern 111, proper alignment of the lower light blocking member 320 within the color conversion display panel 300 can be determined. That is, the first layer pattern 130 disposed at a center of the first light blocking pattern 110 defines the lower light blocking member 320 as being properly aligned within the color conversion display panel 300.

Referring to FIG. 8 and FIG. 9, a fourth alignment key 103 includes a fourth light blocking pattern 110, a fourth display pattern 114, and a fourth layer pattern 130.

The fourth light blocking pattern 110, the fourth layer pattern 130, and the fourth display pattern 114 are disposed in an alignment area 10 of a substrate 310. A red color filter 330R is disposed in a display panel 20 including a portion of the substrate 310.

The fourth light blocking pattern 110 and the fourth layer pattern 130 are disposed spaced apart from each other, while defining an opening 125 therebetween. The fourth display pattern 114 is disposed at a lower right corner area of the fourth light blocking pattern 110, and extends from an outer edge of the fourth light blocking pattern 110.

In an exemplary embodiment of a method of manufacturing a display device, the fourth light blocking pattern 110 is patterned in advance in the alignment area 10 before the fourth layer pattern 130 is provided or formed. The fourth light blocking pattern 110 defines an opening 125 surrounded by inner edges of the fourth light blocking pattern 110. The fourth display pattern 114 may be simultaneously patterned when the fourth light blocking pattern 110 is provided or formed, or may be patterned when the fourth layer pattern 130 is provided or formed.

When a green color filter 330G of the display panel 20 is provided or formed, the fourth layer pattern 130 is provided or formed in the opening 125 of the fourth alignment key 103. Accordingly, the fourth layer pattern 130 is provided or formed as a respective portion of a same material layer on the substrate 310 as the green color filter 330G. Although FIG. 9 illustrate that the fourth layer pattern 130 is thicker than the fourth light blocking pattern 110 and thinner than the red color filter 330R and the green color filter 330G, relative to an upper surface of the substrate 310, thicknesses of these patterns are not limited thereto. In an exemplary embodiment, the thickness of the fourth layer pattern 130 may vary depending on a patterned material.

Thus, it can be determined that the green color filter 330G is provided or formed in the color conversion display panel 300 since the fourth layer pattern 130 provided or formed in the fourth alignment key 103 that includes the fourth display pattern 114. Additionally, it can be determined whether the green color filter 330G is properly aligned within the display panel 20, according to the position of the fourth layer pattern 130 relative to the fourth light blocking pattern 110 in the fourth alignment key 103 that includes the fourth display pattern 114. In an exemplary embodiment, when the fourth layer pattern 130 is disposed at a center of the fourth light blocking pattern 110 in the fourth alignment key 103 that includes the fourth display pattern 114, proper alignment of the green color filter 330G within the color conversion display panel 300 can be determined. That is, the fourth layer pattern 130 disposed at a center of the fourth light blocking pattern 110 defines the green color filter 330G as being properly aligned within the color conversion display panel 300.

The display pattern PTN may be provided or formed one-to-one corresponding to each of the above-described first to eighth positions, or may be provided or formed in a plurality corresponding to a respective one among the first to eighth positions of the alignment key.

Figure 10:
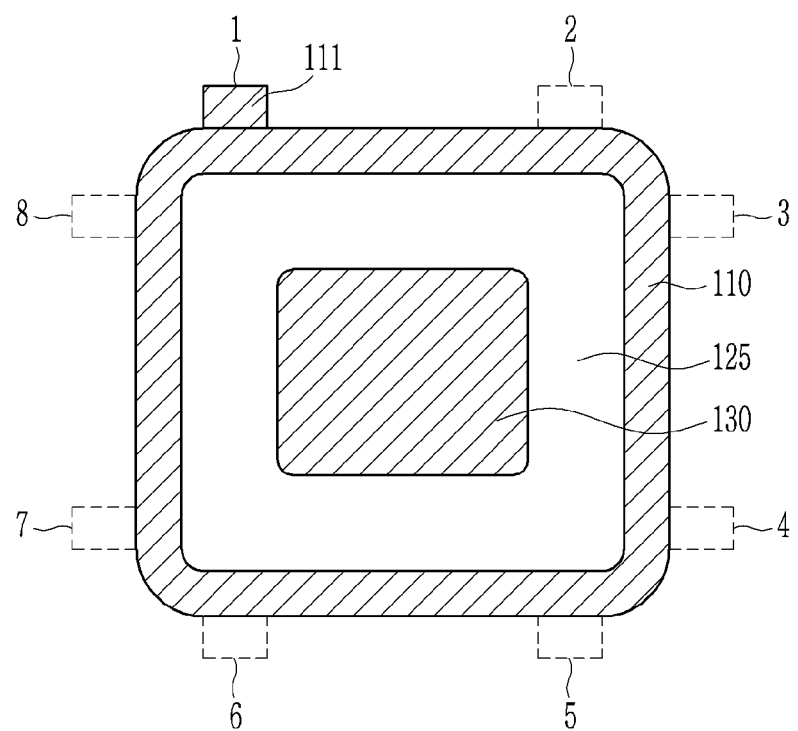
FIG. 10 to FIG. 12 are cross-sectional views of exemplary embodiments of alignment keys in an alignment area of a display device.
Figure 11:
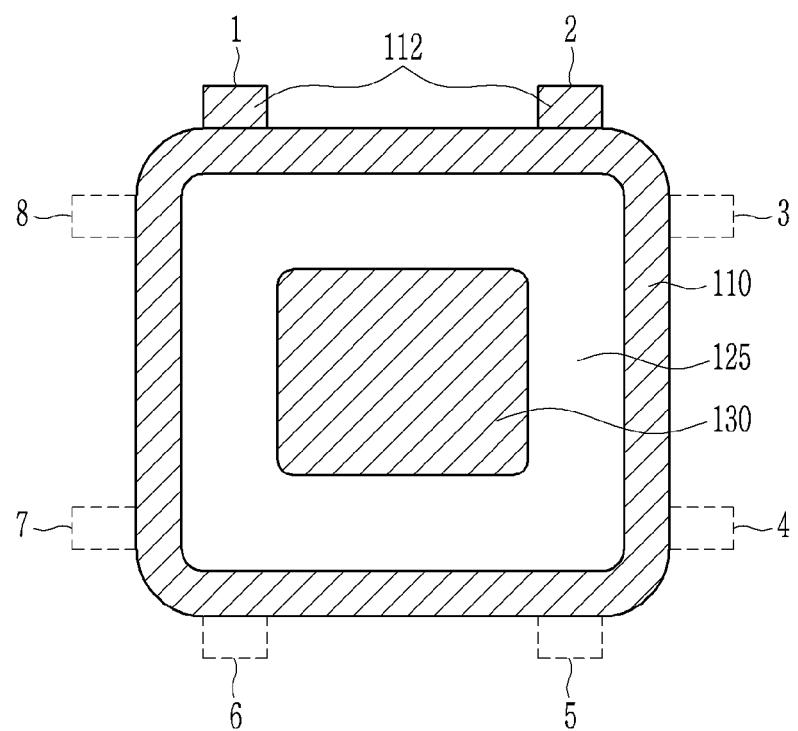
Figure 12:
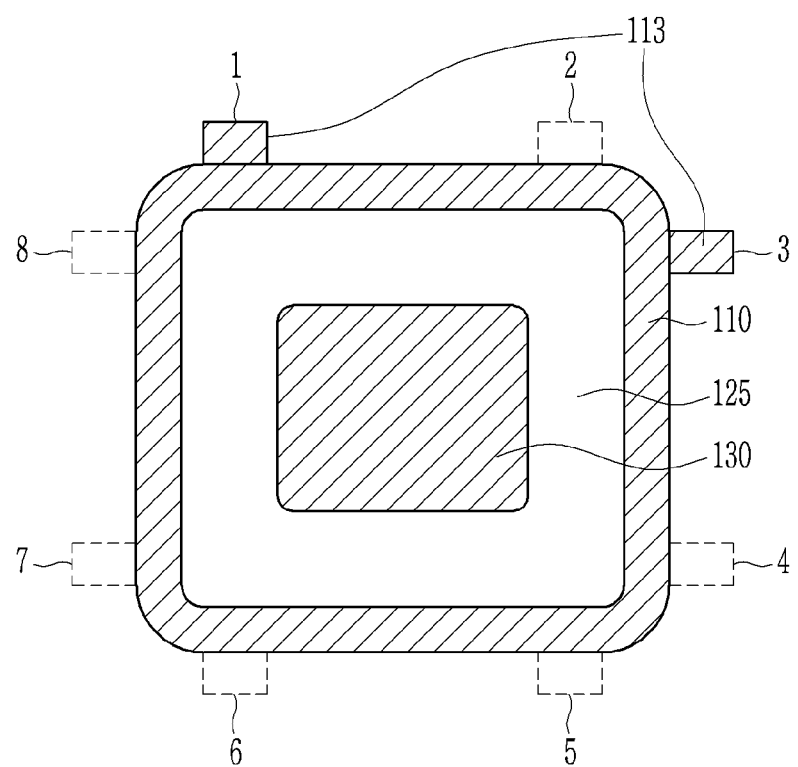

FIG. 10 to FIG. 12 illustrate exemplary embodiments of an alignment key including a plurality of display patterns PTN. In FIG. 10 to FIG. 12, a first alignment key 100, a second alignment key 101, and a third alignment key 102 are illustrated, but a plurality of alignment keys may be provided in a same one of the alignment area 10 depending on exemplary embodiments. In an exemplary embodiment, n alignment keys may be provided or formed corresponding to a color conversion display panel 300 that includes n layers (e.g., members, filters, etc.), and layers within an alignment key to be provided or formed corresponding to the n layers of the color conversion display panel 300 may be set in advance in the n alignment keys.

In addition, in the alignment keys of FIG. 10 to FIG. 12, corner areas of a light blocking pattern 110 are partitioned into first to eighth positions, and each position is marked by a dotted line. The Arabic numbers 1, 2, 3, 4, 5, 6, 7, and 8 marked by the dotted lines respectively imply the first position to the eighth position.

First, referring to FIG. 10, in a first alignment key 100, a display pattern PTN is formed at the first position, and the display pattern PTN implies a first display pattern 111. The first alignment key 100 is an alignment key where a layer pattern 130 is provided formed for the first time among the plurality of alignment keys within the alignment area 10, and the layer pattern 130 is provided or formed only at one position to form a referential display pattern. Accordingly, a layer pattern 130 corresponding to the first display pattern 111 is provided or formed in the first alignment key 100, and the layer pattern 130 is provided or formed as a portion of a same material layer as a layer provided or formed for the first time in the color conversion display panel 300.

The second alignment key 101 to the n-th alignment key provided or formed after the first alignment key 100 include a plurality of patterns provided or formed at the first position to the eighth position to correspond to the number of the plurality of alignment keys. Patterns are provided or formed with various combinations at the first to eighth positions such that the first display pattern 111 to the n-th display pattern are provided or formed within the alignment area 10.

FIG. 11 and FIG. 12 sequentially illustrate providing or formations of the second display pattern 112 to the n-th display pattern at two positions when the plurality of alignment keys are provided or formed in order from the second alignment key 101 to the n-th alignment key.

Referring to FIG. 11, display patterns PTN are provided or formed at the first position and the second position in the second alignment key 101, and the patterns imply a second display pattern 112. Coordinates of display patterns PTN provided or formed along the clockwise direction with reference to the first position to the eighth position may be denoted as (1, 2), (1, 3), (1, 4), . . . and, in this case, the second display pattern 112 may be provided formed at the coordinates (1, 2).

Referring to FIG. 12, display patterns PTN may be provided or formed at the first position and the third position in the third alignment key 102, and the display patterns PTN imply a third display pattern 113. That is, the third display pattern 113 may be provided or formed at the coordinates (1, 3).

Although not illustrated in the drawings, when two display patterns PTN are provided or formed at the first position to the eighth position, according to the sequence of the display pattern PTN shown in FIG. 10, FIG. 11 and FIG. 12, the fourth display pattern 114 (as a collection of display patterns PTN) of the fourth alignment key 103 may be located at the first position and the fourth position, that is, the coordinates (1, 4), the fifth display pattern (as a collection of display patterns PTN) of the fifth alignment key 104 may be located at the first position and the fifth position, that is, the coordinates (1, 5), and the sixth display pattern (as a collection of display patterns PTN) of the sixth alignment key 105 may be located at the first and sixth positions, that is, the coordinates (1, 6). The seventh alignment key 106 and the eighth alignment key 107 described above may follow from the alignment keys described above.

Accordingly, when a plurality of alignment keys are provided in a single one of the alignment area 10, a ninth display pattern (as a collection of display patterns PTN) of a ninth alignment key may be located at the second position and the third position, that is, the coordinates (2, 3), and a tenth display pattern (as a collection of display patterns PTN) of a tenth alignment key may be located at the second position and the fourth position, that is, the coordinates (2, 4). According to one or more exemplary embodiment, since display patterns PTN are provided or formed at two different positions among the first to eighth positions within a single one of the alignment key, the display patterns PTN may be implemented as a first display pattern 111 to an twenty-eighth display pattern.

In an exemplary embodiment, when twenty-eight alignment keys are provided in a single one of the alignment area 10, twenty-eight display patterns PTN may be used within the twenty-eight alignment keys. When display patterns PTN are provided or formed at three different positions among the first position to the eighth position within a single one of the alignment key, the display patterns PTN may be implemented as the first display pattern 111 to the fifty-sixth display pattern, and thus these display patterns PTN may be used when fifty-six alignment keys are provided in a single one of the alignment area 10.

That is, since the color conversion display panel 300 including n layers (e.g., members, filters, etc.) corresponds to n alignment keys, and edges of a light blocking pattern 110 are partitioned into various regions in each of the n alignment keys, n display patterns PTN can be implemented by combinations of a plurality of display patterns PTN located at different positions within a single one of the alignment key depending on the partitioned areas. Accordingly, the number of display patterns PTN that may be aligned when a plurality of alignment keys are provided formed can be variously implemented.

In addition, the layer pattern 130 provided or formed in the plurality of alignment keys may be used to determine which layer of the color conversion display panel 300 corresponds to each display pattern PTN among the plurality of alignment keys, and whether the layers of the color conversion display panel 300 are properly aligned.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:
1. A display device comprising:
a substrate including:
a non-display area comprising an alignment area, and
a display area comprising a plurality of material layers arranged along a thickness direction of the substrate; and
in the alignment area, a plurality of alignment keys including a first alignment key and a second alignment key,
wherein
each of an alignment key among the first alignment key and the second alignment key comprises:
a light blocking pattern comprising an outer edge which defines an outer border of the alignment key,
a layer pattern inside of the light blocking pattern and spaced apart therefrom,
a plurality of positions spaced apart from each other along the outer edge of the light blocking pattern, and
at a position among the plurality of positions, a display pattern extended from the outer edge of the light blocking pattern, in a direction away from the layer pattern,
the position of the display pattern within the first alignment key is different from the position of the display pattern within the second alignment key, among the plurality of positions of the alignment key,
the layer pattern of the alignment key and one material layer among the plurality of material layers of the display area, are respective portions of a same material layer on the substrate, and
the layer pattern of the first alignment key and the layer pattern of the second alignment key are respective portions of different material layers among the plurality of material layers on the substrate.

2. The display device of claim 1, wherein the light blocking pattern, the layer pattern and the display pattern are in a same layer on the substrate.

3. The display device of claim 1, wherein within the alignment key:
the layer pattern inside of the light blocking pattern is spaced apart from the light blocking pattern along a first direction and a second direction which crosses the first direction,
the light blocking pattern includes a corner area extended further than the layer pattern along both the first direction and the second direction, and
the position along the outer edge of the light blocking pattern is within the corner area of the light blocking pattern.

4. The display device of claim 1, wherein within the alignment key:
the light blocking pattern has a shape which defines a corner, and
the display pattern extends directly from the outer edge of the light blocking pattern at the corner.

5. The display device of claim 1, wherein within the alignment key, the light blocking pattern or the layer pattern has a shape of a square.

6. The display device of claim 1, wherein
the alignment key further comprises an opening defined between the light blocking pattern and the layer pattern spaced apart from each other, and
the light blocking pattern surrounds the opening.

7. The display device of claim 1, wherein
the light blocking pattern is a pattern of a first patterning process and the layer pattern is pattern of a second patterning process which is performed after the first patterning process, and
the display pattern is a pattern of the first patterning process or the second patterning process.

8. The display device of claim 1, wherein
the plurality of material layers of the display area comprises a light blocking member layer, a color filter layer, a color conversion layer and a light transmissive layer,
the position of the display pattern within the first alignment key corresponds to one layer among the light blocking member layer, the color filter layer, the color conversion layer, and the light transmissive layer, and
the position of the display pattern within the second alignment key corresponds to a different one layer among the light blocking member layer, the color filter layer, the color conversion layer, and the light transmissive layer.

9. A display device comprising:
a substrate including:
a non-display area comprising an alignment area, and
a display area comprising a plurality of material layers arranged along a thickness direction of the substrate; and a plurality of alignment keys in the alignment area, each of an alignment key among the plurality of alignment keys including:
   a light blocking pattern having a shape of a polygon comprising an outer edge which defines an outer border of the alignment key,
   a layer pattern inside of the light blocking pattern and spaced apart therefrom,
   a plurality of positions spaced apart from each other along the outer edge of the light blocking pattern, and
   at different positions among the plurality of positions, a plurality of display patterns respectively extended from the outer edge of the light blocking pattern, in a direction away from the layer pattern,
wherein
a combination of the different positions of the plurality of display patterns within the alignment key corresponds to one material layer among the plurality of material layers of the display area, and
the layer pattern within the alignment key and the one material layer among the plurality of material layers of the display area which corresponds to the combination of the different positions of the plurality of display patterns within the alignment key, are respective portions of a same material layer on the substrate.

10. The display device of claim 9, wherein the light blocking pattern, the layer pattern and the plurality of display patterns are in a same layer on the substrate.

11. The display device of claim 9, wherein within the alignment key:
   the layer pattern inside of the light blocking pattern is spaced apart from the light blocking pattern along a first direction and a second direction which crosses the first direction,
   the light blocking pattern includes a corner area extended further than the layer pattern along both the first direction and the second, and
   each of the different positions of the plurality of display patterns is within the corner area of the light blocking pattern.

12. The display device of claim 9, wherein within the alignment key:
   the shape of the polygon further comprises a corner, and
   the plurality of display patterns extends directly from the outer edge of the light blocking pattern at the corner.

13. The display device of claim 9, wherein
   the alignment key further comprises an opening defined between the light blocking pattern and the layer pattern spaced apart from each other, and
   the light blocking pattern surrounds the opening.

14. The display device of claim 9, wherein
   the light blocking pattern is a pattern of a first patterning process and the layer pattern is pattern of a second patterning process which is performed after the first patterning process, and
   the plurality of display patterns are patterns of the first patterning process or the second patterning process.

15. The display device of claim 9, wherein the display area further comprises a color conversion display panel defining the plurality of material layers arranged along the thickness direction of the substrate, the plurality of material layers comprising:
   an upper light blocking member on the substrate;
   a first lower light blocking member, a second lower light blocking member, and a third lower light blocking member arranged in a direction along the substrate, between the upper light blocking member and the substrate;
   in the direction along the substrate,
      a red color filter between the first lower light blocking member and the second lower light blocking member; and
      a green color filter between the second lower light blocking member and the third lower light blocking member;
   a red color conversion layer corresponding to the red color filter;
   a green color conversion layer corresponding to the green color filter;
   a transmissive layer corresponding to the third lower light blocking member; and
   an auxiliary light blocking member facing the substrate with the upper light blocking member therebetween.

16. The display device of claim 15, wherein the one material layer among the plurality of material layers of the display area which corresponds to the combination of the different positions of the plurality of display patterns within the alignment key, includes any one of the first lower light blocking member, the second lower light blocking member, the third lower light blocking member, the upper light blocking member, the red color filter, the green color filter, the red color conversion layer, the green color conversion layer, the transmissive layer and the auxiliary light blocking member.

17. The display device of claim 15, wherein the first lower light blocking member, the second lower light blocking member and the third lower light blocking member of the color conversion display panel block blue light.

18. The display device of claim 15, wherein
   the red color conversion layer and the green color conversion layer of the color conversion display panel comprise semiconductor nanocrystals, and
   the transmissive layer of the color conversion display panel comprises light scatterers which scatter light.

19. A display device comprising:
   a substrate including:
      a display area comprising:
         a lower light blocking member; and
         an upper light blocking member facing the substrate with the lower light blocking member therebetween; and
      a non-display area adjacent to the display area and comprising
   an alignment area; and
   a plurality of alignment keys in the alignment area, including a first alignment key and a second alignment key spaced apart from each other, each of an alignment key among the first alignment key and the second alignment key comprising an outer border, and a first position and a second position spaced apart from each other along the outer border,
wherein
the first alignment key includes:
   a first light blocking pattern comprising an outer edge which defines an outer border of the first alignment key,
   a first layer pattern inside of the first light blocking pattern and spaced apart therefrom, and
   at the first position of the alignment key, a first display pattern extended from the outer edge of the first light blocking pattern, in a direction away from the first layer pattern, wherein the first layer pattern of the first alignment key and the lower light blocking member of the display area are respective portions of a same material layer on the substrate; and the second alignment key includes:
- a second light blocking pattern comprising an outer edge which defines an outer border of the second alignment key,
- a second layer pattern inside of the second light blocking pattern and spaced apart therefrom, and
- at the second position of the alignment key, a second display pattern extended from the outer edge of the second light blocking pattern, in a direction away from the second layer pattern,
- wherein the second layer pattern of the second alignment key and the upper light blocking member of the display area are respective portions of a same material layer on the substrate.

20. The display device of claim 19, wherein within the first alignment key,
- the first layer pattern inside of the first light blocking pattern is spaced apart from the first light blocking pattern along a first direction and a second direction which crosses the first direction,
- the first light blocking pattern includes a corner area extended further than the first layer pattern along both the first direction and the second direction, and
- the first position and the second position of the alignment key are within the corner area of the first light blocking pattern.

* * * * *